United States Patent [19]

Congdon

[11] Patent Number: 4,594,558
[45] Date of Patent: Jun. 10, 1986

[54] HIGH-SWITCHING-SPEED D.C. AMPLIFIER WITH INPUT-OFFSET CURRENT COMPENSATION

[75] Inventor: James S. Congdon, Sudbury, Mass.

[73] Assignee: Genrad, Inc., Concord, Mass.

[21] Appl. No.: 722,598

[22] Filed: Apr. 12, 1985

[51] Int. Cl.$^4$ ............................ H03F 1/14; H03F 3/26
[52] U.S. Cl. ........................................... 330/9; 330/51; 330/263
[58] Field of Search ............... 330/9, 51, 149, 263, 330/265, 267, 307, 311, 10; 324/123 R

[56] References Cited

U.S. PATENT DOCUMENTS

| | | | |
|---|---|---|---|
| 3,594,590 | 7/1971 | Smith | 330/252 |
| 3,740,657 | 6/1973 | Tharmaratnam | 330/262 |
| 3,769,525 | 10/1973 | Foss et al. | 307/254 |
| 3,783,307 | 1/1974 | Breuer | 307/243 |
| 4,109,166 | 8/1978 | Clark, Jr. et al. | 307/237 |
| 4,191,856 | 3/1980 | Nagano et al. | 179/15 A |
| 4,240,040 | 12/1980 | Saari | 330/255 |
| 4,306,199 | 12/1981 | Kondou | 330/268 |
| 4,352,073 | 9/1982 | Leuthold | 330/264 |
| 4,356,452 | 10/1982 | Iwamatsu | 330/265 |
| 4,390,987 | 6/1983 | Best | 370/112 |
| 4,394,625 | 7/1983 | Sakai | 330/267 |
| 4,415,815 | 11/1983 | Dijkmans et al. | 307/243 |
| 4,419,592 | 12/1983 | Norgren et al. | 307/241 |
| 4,446,440 | 5/1984 | Bell | 330/51 X |
| 4,465,971 | 8/1984 | Abeyta | 324/158 R |

FOREIGN PATENT DOCUMENTS 55-535520 3/1980 Japan.
55-115708 9/1980 Japan.

*Primary Examiner*—Eugene R. LaRoche
*Assistant Examiner*—Steven J. Mottola
*Attorney, Agent, or Firm*—Cesari and McKenna

[57] ABSTRACT

A driver-sensor circuit for a circuit-testing device has a sensor amplifier (Q1, Q2, Q3, and Q4) for sensing the voltage on a device under test connected to its input-output terminal (12). The driver-sensor circuit also includes a driver amplifier (Q5, Q6, Q7, and Q8) for driving the same terminal (12). The driver amplifier (Q5, Q6, Q7, and Q8) can be switched on and off, and a limiting amplifier (Q9, Q10, Q11, and Q12) applies the sensor-amplifier output voltage to the input terminal (20) of the driver circuit (Q5, Q6, Q7, and Q8) to keep the reverse bias on the driver-amplifier transistors (Q5, Q6, Q7, and Q8) to a minimum. To eliminate offset bias current at the input terminal 12 of the sense amplifier (Q1, Q2, Q3, and Q4), compensation transistors (Q15, Q16) matching the input-stage transistors (Q1, Q2) of the driver amplifier have their bases tied together to force their base currents to cancel. The resultant emitter currents of the compensation transistors (Q15, Q16) are sensed by amplifiers (52, 54) that control the emitter currents of the first-stage transistors (Q1 and Q2) so that their emitter currents are the same as the emitter currents of the compensation transistors (Q15, Q16). In this way, the base currents of the first-stage transistors (Q1, Q2) are forced to be opposite and thus cancel.

11 Claims, 3 Drawing Figures

HIGH-SWITCHING-SPEED D.C. AMPLIFIER WITH INPUT-OFFSET CURRENT COMPENSATION

BACKGROUND OF THE INVENTION

The present invention is directed to electronic amplifiers, particularly those of the type employed in automatic equipment for testing electronic circuitry.

In many electronic circuits, some of the circuit terminals can act alternately as input terminals and as output terminals, and they often change rapidly between these modes. In order to test such circuits, therefore, the test equipment must have corresponding common terminals that can be used both to drive the terminals of the circuit under test and to sense the signals on those terminals. The changing between sensing and driving functions must occur very rapidly in some cases, and this can present difficulties in the test circuitry.

Specifically, the driver amplifier, which applies the output signal from the test equipment to the device under test, is required to change rapidly from a high-impedance state to a driving condition, and this can cause transients that should not be applied to the device under test. In addition, while the driver amplifier is in its high-impedance state but still connected to the terminal of the device under test, that terminal could carry voltages that would cause the transistors in the amplifier to break down.

A design parameter of particular concern in sensor amplifiers generally, including those in driver-sensor combinations, is the input offset current. Offset current at the input terminal of a sensor amplifier can affect the sensed signal, so input offset current should be kept to a minimum.

In one method used in the past to minimize input bias current, the collector current of an amplifier's input transistor is supplied by the emitter of a collector-circuit transistor that is identical to the input-stage transistor and is connected between the supply rail and the collector of the input-stage transistor. Because the emitter current of this collector-circuit transistor is the same as the collector current of the amplifier transistor, the base currents of these two transistors are nearly equal. A current-mirror circuit produces a current equal to the base current of the collector-circuit transistor and feeds it to the base of the amplifier's input transistor. Since the input transistor receives all of its base current from the current mirror, very little current is drawn from or supplied to whatever circuit drives the amplifier input terminal.

While this arrangement can be quite effective in reducing input offset current, it is appropriate only for monolithic circuits having only one type (npn or pnp) of relatively fast transistor; it is not readily adapted to an amplifier whose input stage comprises complementary transistors.

It is accordingly an object of the present invention to change between the driving and high-impedance states of a driver amplifier at a rapid rate, with a minimum of transients, and without the danger that terminal voltages will cause driver-amplifier transistors to break down when the amplifier is in its high-impedance state.

It is another object of the invention to minimize input offset current in an amplifier having a complementary-transistor input stage.

SUMMARY OF THE INVENTION

Certain of the foregoing and related objects are achieved in a disconnectable unity-gain driver amplifier that employs a limit amplifier to keep the voltage at its input node near to that at its output node when the driver amplifier is switched off. Since there is thus little potential difference between the input and output of the driver amplifier, high voltages on the output node do not break down the transistors in the driver amplifier. Furthermore, the charge on the amplifier transistors is low, so switching speed is high and large switching transients are avoided.

In accordance with another aspect of the invention, the driver amplifier has a complementary emitter-follower amplifier stage comprising a pair of amplifier transistors of opposite polarities. The input node of the amplifier is connected to the bases of the amplifier transistors, and the amplifier's input bias current is minimized by circuitry that includes a pair of current-compensation transistors of opposite polarities, each compensation transistor being associated with, and matching, the amplifier transistor of the same polarity. The bases of the current-compensation transistors are connected together to force their base currents to be equal in magnitude but opposite in direction. The amplifier bias circuit causes the collector bias currents of the amplifier transistors to equal the collector bias currents of the compensation transistors. Since the collector bias currents of the amplifier transistors equal those of their associated compensation transistors, the base currents of the associated pairs of transistors are also equal. Thus, the amplifier base currents, like the compensation-transistor base currents, cancel, and the input bias current is minimal.

In order to cause the bias collector currents of the amplifier transistors to equal those of the current-compensation transistors, the bias circuit for the amplifier includes a bias current source and a bias current sink associated with respective amplifier transistors. Control signals applied to the bias current source and bias current sink cause them to set the collector currents of their associated amplifier transistors in accordance with the magnitudes of the control signals. These control signals are applied by control circuitry that senses the collector currents of the current-compensation transistors and applies control signals to the bias current source and bias current sink to set the collector currents of their associated amplifier transistors so that they equal the collector currents of their respective current-compensation transistors. The amplifier-transistor base currents thus cancel and minimize the input offset current.

Further aspects of the invention are discussed in the following description and defined in the appended claims.

BRIEF DESCRIPTION OF THE DRAWINGS

These and further features and advantages of the present invention are described in connection with the accompanying drawings, in which.

DETAILED DESCRIPTION OF THE PREFERRED EMBODIMENT

Figure 1:
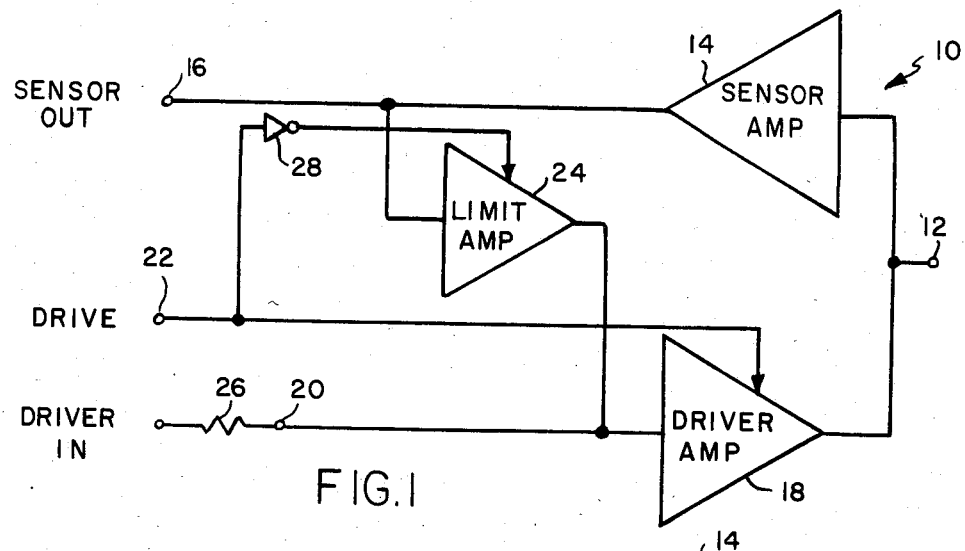
FIG. 1 is a simplified block diagram of the driver-sensor circuit of the present invention.

FIG. 1 depicts a driver-sensor circuit 10 employed alternatively to drive circuitry connected to a node 12 of the circuit and sense the signal present on that node. A sensor amplifier 14 receives the signal on node 12 and amplifies it with unity gain to provide an amplified version at a sensor output terminal 16.

To drive node 12, a driver amplifier 18 amplifies a driver input signal on terminal 20 and applies it to node 12. Driver amplifier 18 can be in either a driver state, in which it drives the output node 12, or an inactive state, in which it presents a high impedance to that node. The state that it assumes is determined by the signal on drive input node 22.

A further amplifier 24, which will be referred to as the "limiting" amplifier, amplifies the output of sensor amplifier 14 with unity voltage gain and applies the result to the input terminal of the driver amplifier 18. The limiting amplifer 24 also drives the output impedance of the driver input source. This output impedance is shown explicitly as a resistor 26. The limiting amplifier 24 is operative to place this voltage at the driver-amplifier input terminal only while the driver amplifier is turned off. (For the sake of simplicity, this fact is depicted in FIG. 1 by an inverter 28 that produces the complement of the drive signal on node 22 and applies it as the control input to the limiting amplifier 24. The actual arrangement is different and will be described in connection with FIG. 3.)

The purpose of the limiting amplifier 24 is to keep the driver amplifier's input and output voltage levels near each other while the driver amplifier 18 is in its inactive (high-impedance) state. This is beneficial because it limits the reverse bias on the driver amplifier's emitter-base junction and thus minimizes the charge that must be swept away in order to turn those transistors back on. The driver amplifier 18 can thus be changed rapidly between its low- and high-impedance states.

It should be noted that the sensor amplifier 14 could also perform the function of the limiting amplifier, eliminating the need to employ a separate amplifier for that purpose. Specifically, the sensor amplifier could be connected across the driver amplifier and would be disconnectable. In such an arrangement, the sensor amplifier would also act as the limiting amplifier. The reason why a separate limiting amplifier was used in the illustrated embodiment is that it was desired to have a sensor-amplifier output even while the driver amplifier is active, and the limiting amplifier must be inactive while the driver amplifier is active.

Figure 2:
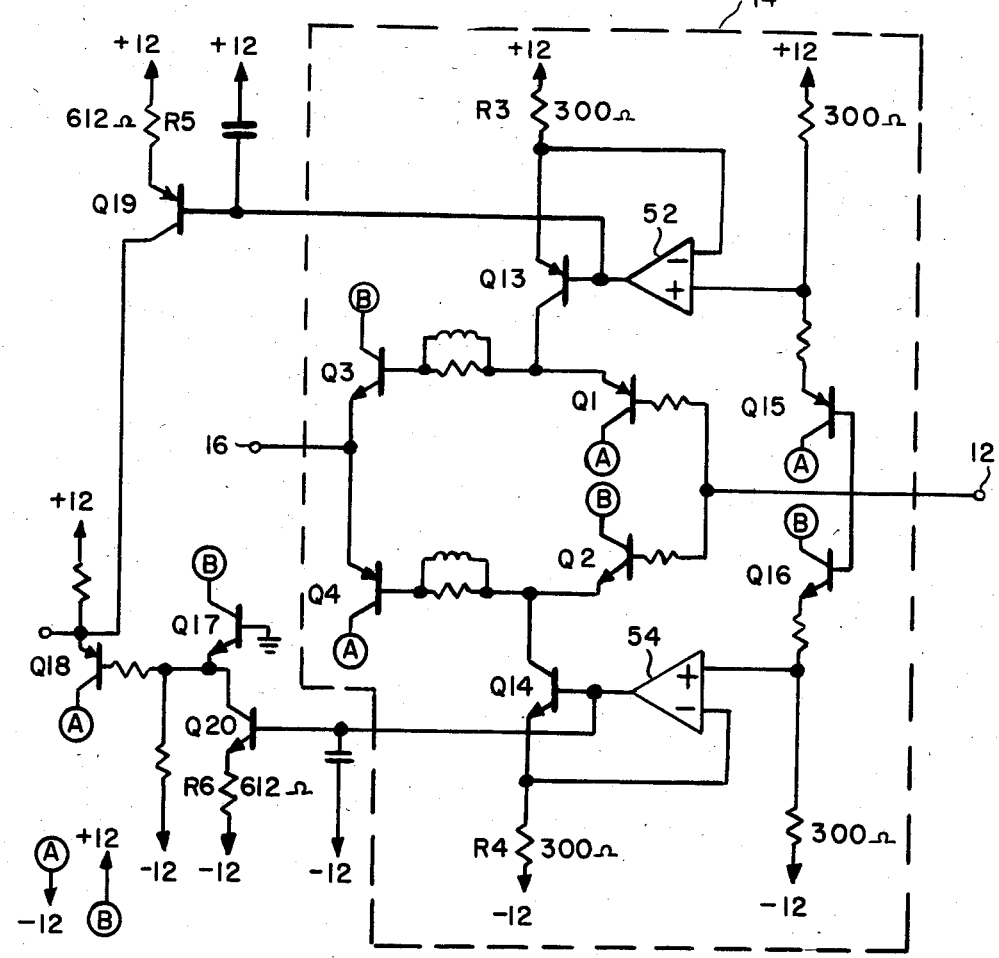
FIG. 2 is a schematic diagram of the sensor amplifier and related circuitry.
Figure 3:
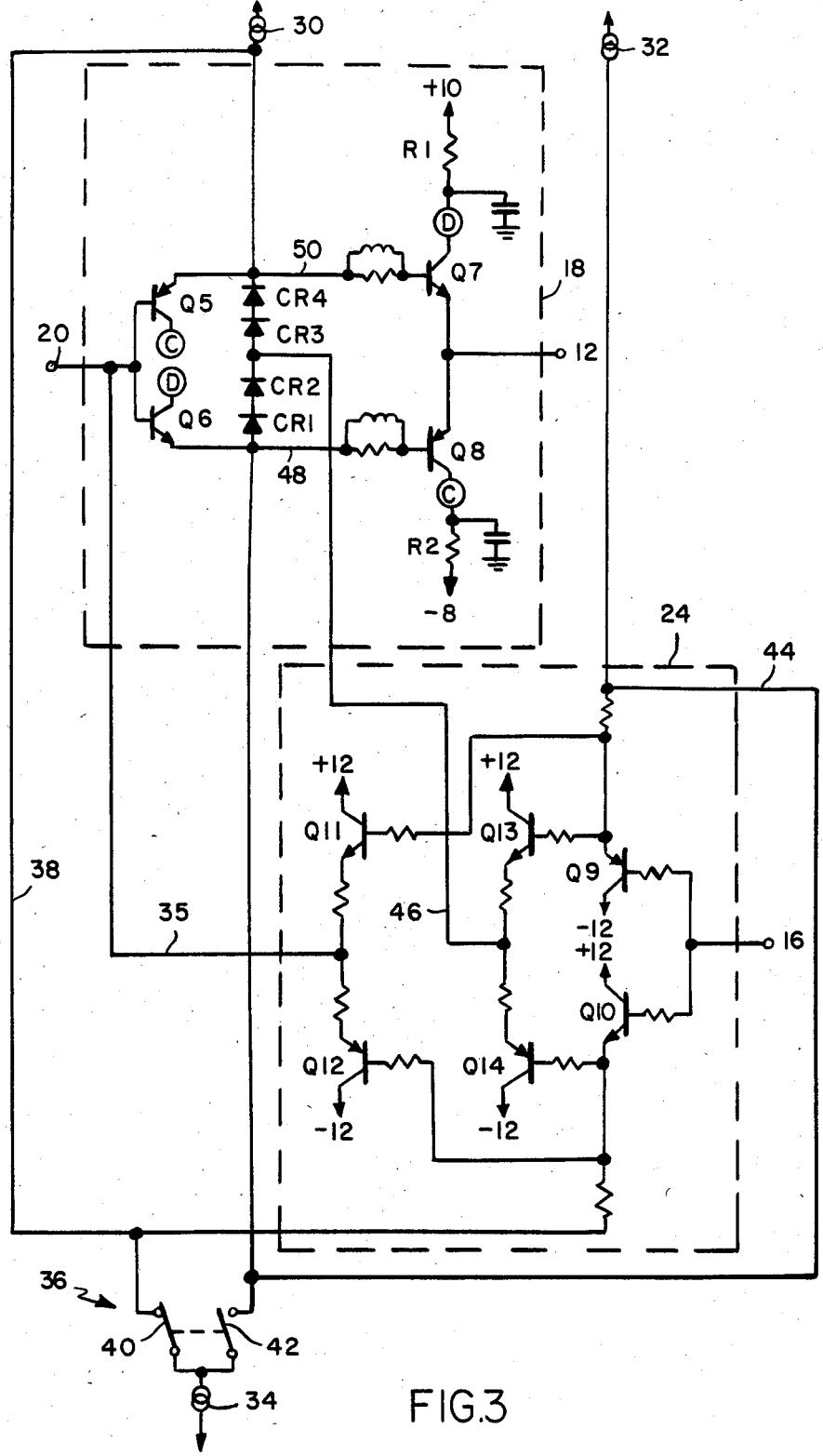
FIG. 3 is a schematic diagram of the driver and limit amplifiers.

FIGS. 2 and 3 show the circuitry of FIG. 1 in more detail. The sensor amplifier 14 is illustrated in FIG. 2. It includes a first emitter-follower amplifier stage comprising two complementary transistors Q1 and Q2. The outputs of these transistors are fed, through frequency-compensation networks in the illustrated embodiment, to the bases of further complementary transistors Q3 and Q4. Transistors Q3 and Q4 are also connected in an emitter-follower configuration, so the four transistors together form a unity-voltage-gain amplifier. Transistors Q1 and Q4 are formed on the same substrate, and the notation "A" on their collectors indicates that they share a collector, the common substrate. The substrate is connected to a −12-volt source. Transistors Q2 and Q3 are both on another common chip, whose substrate is their common collector, as the "B" notation indicates. This collector is connected to a +12-volt source.

The remainder of the circuitry of the sensor amplifier 14 shown in FIG. 2 provides the bias currents for the amplifier transistors Q1, Q2, Q3, and Q4. Before discussing this circuitry, however, we will turn to FIG. 3 for a discussion of the driver amplifier 18 and the limiting amplifier 24.

Like the sensor amplifier 14, the driver amplifier 18 includes two emitter-follower stages, each of which includes a pair of complementary transistors. The first driver stage consists of transistors Q5 and Q6, which receive the driver input signal at their bases and amplify it with unity voltage gain. The resultant signals propagate through frequency-compensation networks to the bases of transistors Q7 and Q8, which comprise the second stage of the driver amplifier.

As the "C" and "D" notations indicate, transistors Q5 and Q8 are formed on the same chip and share a common collector, while transistors Q6 and Q7 are formed on another chip and also share a common collector. The collector connections for the common collector are shown in the second stage of the driver amplifier; the "D" collector is connected to a +10-volt source through a small current-sensing resistor R1, while the "C" collector is connected to a −8-volt source through another small current-sensing resistor R2.

Current sources 30 and 32 and current sink 34 provide the bias currents for both the driver amplifier 18 and the limiting amplifier 24, as will be described in more detail below. By means of circuitry not shown in the drawings, the small voltages across R1 and R2 are used to control the current sources 30 and 32 and current sink 34 so as to prevent transistors Q7 and Q8 from being overloaded.

The limiting amplifier 24 includes a first emitter-follower stage comprising two complementary transistors Q9 and Q10 as well as a second emitter-follower stage comprising two further complementary transistors Q11 and Q12, which receive signals at their bases from the emitters of the first-stage transistors Q9 and Q10. The output of the limiting amplifier 24 is transmitted over a signal line 35 to the driver-amplifier input node 20 for the purpose mentioned above in connection with FIG. 1.

In order to change the driver amplifier 18 and limit amplifier 24 to their high- and low-impedance states, a double-pole electronic switch 36 is provided to control the paths taken by the bias currents from the current sources 30 and 32. In the state illustrated in FIG. 3, the driver amplifier 18 is in its high-impedance state and the limit amplifier 24 is in its low-impedance state. In that state, current from current source 30, which provides bias current to the driver amplifier 18 when that amplifier is on, is diverted around the driver amplifier 18 by a line 38 connected to closed contacts 40 of the switch 36 so that the current source 30 is connected directly to the current sink 34. Consequently, the driver amplifier 18 is in its high-impedance state. In contrast, contacts 42 of switch 36 are open, so the current from current source 32 cannot flow directly through another line 44 to the current sink 34. Instead, that current must flow through the limiting amplifier 24 in order to reach the current sink 34 through closed contacts 40.

When switch 36 is in its other state, in which contacts 40 are open and contacts 42 are closed, current from current source 30 must pass through the driver amplifer 18, and thereby provide it with bias curent, in order to reach the current sink 34 through the now-closed contacts 42. In this alternate state, the limit amplifier 24 is in its high-impedance state because the current from current source 32 is diverted around that amplifier by line 44 and the now-closed contacts 42.

It should be recognized that the circuit of the present invention is intended for rapid operation, and switch 36 is accordingly an electronic switch even though it has been described in terms of "contacts" for purposes of explanation.

In the state illustrated in FIG. 3, the limiting amplifier 24 limits the reverse voltage applied to the base-emitter junctions of the transistors Q5, Q6, Q7, and Q8 of the driver amplifier 18. Specifically, the input node 16 of the limiting amplifier is the same as the output node 16 of the sensor amplifier 14, which is a unity-gain amplifier and thus maintains at its output port a voltage that is substantially the same as the voltage at the driver-amplifier output terminal 12. Therefore, the potential difference between the input and the output of the driver amplifier 18 remains very small while that amplifier is in its high-impedance state and thus does not tend to provide a large back bias to any of the driver amplifier's transistor junctions.

Although the portion of the circuit described so far avoids the back biasing that results from potential differences between the input and the output of the driver amplifier 18, it is also necessary to prevent large back-biasing voltages that might result from the action of the current sources 30 and 32 and current sink 34. Accordingly, an amplifier stage wired in parallel with the second stage of the limit amplifier is provided by transistors Q13 and Q14 to produce on line 46 a further replica of the signal on node 16. When the switch 36 is in the state depicted in FIG. 3, transistors Q13 and Q14 are biased to its low-impedance staate. Since Q13 and Q14 are wired in an emitter-follower configuration and receive as their inputs the outputs of the limiting-amplifier first-stage transistors Q9 and Q10, the voltage on line 46 when the driver amplifier 18 is in its high-impedance state is substantially the same as that at nodes 12, 16, and 20.

Line 46 is connected through a series pair of diodes CR1 and CR2 to an intermediate node 48 between Q6 and Q8. This node is thus kept at a voltage that is two diode drops above the voltage at nodes 12 and 20, so the base-emitter junctions of Q6 and Q8 are both back-biased by only a single diode drop and can accordingly be switched very rapidly to their low-impedance states.

Similarly, line 46 is connected through a further series pair of diodes CR3 and CR4 to another intermediate node 50 between transistors Q5 and Q7. The voltage at node 50 is thus maintained at a value that is two diode drops below the voltage at nodes 12 and 20, so Q5 and Q7 are back-biased by only a single diode drop and can accordingly be changed to their low-impedance states quickly. As a result, the driver amplifier 18 is always ready to be switched rapidly to its driving condition.

We now turn to a more detailed description of the sensor amplifier of FIG. 2, which illustrates the way in which the sensor amplifier 14 is prevented from supplying or drawing bias current at the input node 12.

In general, the sensor circuit of the present invention is arranged so that the base bias current of transistor Q1 is very nearly the exact opposite of the base bias current of transistor Q2. Since these currents are exactly opposite, they cancel, so the sensor amplifier neither supplies bias current to nor draws bias current from any device connected to node 12. The base bias currents of Q1 and Q2 are made equal in magnitude by controlling the bias emitter currents of Q1 and Q2. By adjusting these emitter currents in accordance with the relative betas of the transistors, it is possible to make the base currents cancel.

Specifically, the emitter bias current for Q1 is supplied by a current source Q13, while the bias current for Q2 is drawn by a current sink Q14. Q13 and Q14, in turn, are controlled by amplifiers 52 and 54, which sense the emitter currents of two further transistors Q15 and Q16 and cause the emitter currents of source and sink Q13 and Q14 to equal those of transistors Q15 and Q16. Transistors Q15 and Q16 are on the same chips and are of the same types as Q1 and Q2, respectively, and the bases of these transistors Q15 and Q16 are tied together so that their base currents are forced to cancel. Therefore, if Q1 and Q2 have the same emitter currents as Q15 and Q16, the base currents of Q1 and Q2 will cancel, just as those of Q15 and Q16 do. The illustrated arrangement causes the emitter currents of Q1 and Q2 to equal those of Q15 and Q16 because the emitter currents of Q1 and Q2 nearly equal the collector currents of Q13 and Q14, which nearly equal the emitter currents of Q13 and Q14 and thus of Q15 and Q16. Thus, the input offset current is minimized.

When this arrangement for achieving zero offset current is employed, it is often desirable to employ additional circuitry to compensate for voltage offset caused by this input-current compensation. In order to understand this further circuitry, it is important first to realize the offset that occurs in the sensor amplifier consisting of transistors Q1, Q2, Q3, and Q4 even without the input-current compensation. If the signal path is followed from the input node 12 to the output node 16, it is seen that there is a voltage increase of one diode drop across transistor Q1 and then a voltage decrease of one diode drop across transistor Q3. However, the diode drops in transistors Q1 and Q3 are not in general the same; transistor Q1 is a pnp transistor fabricated on a substrate different from that on which npn transistor Q3 is fabricated. Accordingly, they are transistors of different polarities possibly operating at different temperatures and currents. There will thus be some voltage offset in that path.

An identical voltage offset results in the lower path consisting of transistors Q2 and Q4; the paths are wired in parallel, and, in any event, Q2 and Q3 are identical transistors on a common substrate, while Q1 and Q4 are identical transistors on another common substrate.

Since sensor amplifier 14 requires a high degree of accuracy, a further circuit comprising transistors Q17 and Q18 produces a voltage at node 56 that can be used in subsequent circuitry to compensate for the voltage offset. Transistor Q17 is formed on the same substrate as transistors Q2 and Q3 and is identical to them, while transistor Q18 is formed on the same substrate as transistors Q1 and Q4 and is identical to them. Furthermore, these transistors are biased with currents near to those of their corresponding sensor-amplifier transistors Q1, Q2, Q3, and Q4. Without the input-current compensation, the sensor amplifier could be arranged so that the bias current of Q1 equaled that of Q4, while the bias current of Q2 equaled that of Q3. If Q1 and Q4 were biased to the same point, then Q18 could be biased to that point so as to simulate both of them, while Q17 could be biased to simulate both Q2 and Q3 if those two transistors were biased to the same point.

With the input-current compensation, however, the bias currents of the first-stage transistors Q1 and Q2 vary so that their emitter currents are not in general the same, but the emitter bias currents of Q3 and Q4 are nearly equal. As a consequence, it is not possible to keep the bias currents either of all of the npn transistors or of all of the pnp transistors equal. The voltage-compensation transistors Q17 and Q18 therefore can not exactly replicate the voltage offset that results from the differences in base-to-emitter voltages.

According to the present invention, however, the voltage offset that would otherwise be caused by the input-current compensation is minimized. This is accomplished by biasing the voltage-compensation transistors Q17 and Q18 so as to achieve a base-to-emitter voltage that is somewhere between the base-to-emitter voltages of their two corresponding amplifier transistors when those transistors are not biased to the same point. To do this, two further transistors Q19 and Q20 provide variable bias currents to the voltage-compensation transistors Q18 and Q17, respectively. Transistors Q19 and Q20 are controlled by amplifiers 52 and 54, the same amplifiers that control the current source Q13 and current sink Q14. Thus, transistors Q19 and Q20, which are wired in current-source configuration, have the same base voltages as Q13 and Q14, respectively. However, current source Q13 and current sink Q14 drive 300-ohm resistors R3 and R4, respectively, while transistors Q19 and Q20 drive 612-ohm resistors R5 and R6. Transistors Q19 and Q20 thus supply only about half as much current to the emitters of Q18 and Q17 as Q13 and Q14 do to the emitters of amplifier transistors Q1 and Q2.

To provide the remainder of the current necessary to bias Q17 and Q18 to the same points as Q2 and Q1 when those two amplifier transistors have equal emitter currents, resistors R7 and R8 provide bias-current paths to and from voltage sources. With these two sources of bias current, each of the voltage-compensation transistors Q17 and Q18 is biased to same point to which both of its associated amplifier transistors Q1 and Q4 or Q2 and Q3 are when Q1 and Q2 have the same emitter current. When the emitter currents of Q1 and Q2 depart from equality, it is a result of the difference between the currents supplied and drawn by transistors Q13 and Q14. Since the base voltages of Q13 and Q14 control these currents, and since the Q13 and Q14 base voltages also appear at the bases of Q19 and Q20, the difference between the emitter currents of Q1 and Q2 is reflected in a difference between the emitter currents of transistors Q17 and Q18.

However, since emitter resistors R5 and R6 have roughly twice the resistance of emitter resistors R3 and R4, the change in bias current supplied to resistors Q17 and Q18 is only half the change in the currents supplied to transistors Q1 and Q2. As a result, Q17 is biased to a point somewhere between the bias points of Q2 and Q3, while Q18 is biased somewhere between the bias points of Q1 and Q4. Thus, although Q17 and Q18 do not replicate the amplifier voltage offset exactly, they replicate it better than they would if they operated at a fixed bias point. The varying bias reduces the worst-case voltage error considerably from, say, 8 millivolts to, say, 2 millivolts.

It should be recognized that the amplifier described in the accompanying drawings can readily be adapted to other applications as well, such as in a fast-acting accurate sample-and-hold circuit. Thus, the present invention constitutes an advance in the art that has a wide range of applications.

I claim:

1. For selectively driving an object node, an amplifier circuit comprising:
   A. a disconnectable unity-gain driver amplifier having an input node and being operable by application of switching signals thereto to change between driver-high-impedance and driver-low-impedance states, the driver amplifier being connected for driving of the object node with an amplified replica of the signal at its input node when it is in its driver-low-impedance state and for presentation of a high impedance to the object node when it is in its driver-high-impedance state; and
   B. a limiting amplifier for producing as its limiting-amplifier amplifier output a unit-voltage-gain amplified replica of the signal on the object node and applying the limiting amplifier output to the input node of the driver amplifier when the driver amplifier is in the driver-high-impedance state so as to limit the potential difference across the driver amplifier when it in its driver-high-impedance state.

2. An amplifier circuit as defined in claim 1 and further including a unity-gain sensor amplifier connected for sensing the signal at the object node and amplifying it with unit voltage gain to produce a sensor output.

3. A circuit as defined in claim 2 wherein the limiting amplifier is connected to receive the sensor output and amplify it with unit gain to generate the limiting-amplifier output.

4. A d.c. amplifier, including a pair of amplifier transistors of opposite polarity configured in a complementary emitter-follower amplifier stage and having an input node connected to the bases of the amplifier transistors, comprising:
   A. a pair of current-compensation transistors of opposite polarity biased to conduct current along their emitter-collector paths, each current-compensation transistor matching an associated one of the amplifier transistors, the bases of the current-compensation transistors being connected together to force the base currents of the current-compensation transistors to be equal in magnitude but opposite in direction;
   B. a bias current source and a bias current sink associated with respective amplifier transistors and operable by application of control signals thereto to set the collector currents of their associated amplifier transistors in accordance with the magnitudes of the control signals; and
   C. control means for sensing the collector currents of the current-compensation transistors and applying control signals to the bias current source and bias current sink to set the collector currents of their associated amplifier transistors to equal the collector currents of the current-compensation transistors associated therewith, the base currents of the amplifier transistors thereby being kept nearly equal and opposite so as to minimize the input offset current of the amplifier.

5. An amplifier as defined in claim 4 wherein each current-compensation transistor is formed on the same substrate as its associated amplifier transistor.

6. An amplifier as defined in claim 4 further including:
   A. a second amplifier stage connected to receive the output of the first-mentioned amplifier stage and including a pair of second amplifier transistors of opposite polarity configured in a second emitter-follower stage, each second amplifier transistor matching the one of the first-mentioned amplifier transistors of the same polarity and being connected to receive as its input output signals from the first-mentioned amplifier transistor of the other polarity;

B. a pair of voltage-compensation transistors of opposite polarity biased to conduct current through their emitter-collector paths, the base-emitter emitter junctions of the two voltage-compensation transistors being connected in series, each voltage-compensation transistor matching the first and second amplifier transistor of the same polarity;

C. a voltage-compensation bias circuit for biasing each voltage-compensation transistor to conduct an emitter current approximately equal to the emitter current of the first and second amplifier transistors of the same polarity when the emitter currents of those amplifier transistors are equal to each other and for biasing each voltage-compensation transistor to conduct an emitter current having a value between those of the emitter currents of the first and second amplifier transistors of the same polarity when the emitter currents of those amplifier transistors differ, the series combination of the base-to-emitter voltages of the two voltage-compensation transistors thereby approximating the voltage offset through the two stages of the amplifier.

7. An amplifier as defined in claim 6 wherein all voltage-compensation and first and second amplifier transistors of the same polarity are formed on the same substrate.

8. An amplifier as defined in claim 7 wherein each current-compensation transistor is formed on the same substrate as its associated first amplifier transistor.

9. An amplifier as recited in claim 6 in which the voltage-compensation bias circuit includes a second bias current source and a second bias current sink associated with respective voltage-compensation transistors and operable by application of control signals thereto to set the collector currents of their associated voltage-compensation transistors in accordance with the magnitudes of the control signals, the second bias current source and bias current sink being connected to receive as their input signals the control signals from the control means and vary their currents with changes in the control signals by about half as much as the first-mentioned bias current source and bias current sink do.

10. An amplifier as defined in claim 9 wherein all voltage-compensation and first and second amplifier transistors of the same polarity are formed on the same substrate.

11. An amplifier as defined in claim 10 wherein each current-compensation transistor is formed on the same substrate as its associated first amplifier transistor.

* * * * *